(12) United States Patent
Tuttle

(10) Patent No.: US 6,281,685 B1
(45) Date of Patent: Aug. 28, 2001

(54) CABLE SHIELD FAULT LOCATOR

(75) Inventor: John E. B. Tuttle, Falls Church, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 867 days.

(21) Appl. No.: 08/521,393

(22) Filed: Aug. 29, 1995

(51) Int. Cl.[7] .............................. G01R 31/28; G01R 31/08
(52) U.S. Cl. ...................... 324/529; 324/522; 324/523; 324/525; 324/528
(58) Field of Search ........................... 324/529, 528, 324/522, 523, 525, 527, 127; 336/175

(56) References Cited

U.S. PATENT DOCUMENTS

| | | | |
|---|---|---|---|
| 4,142,143 | * 2/1979 | Daniel | 324/529 |
| 4,335,348 | * 6/1982 | Reed | 324/529 |
| 4,370,610 | * 1/1983 | Allen | 324/529 |
| 4,929,903 | * 5/1990 | Saigo | 324/529 |
| 4,973,911 | * 11/1990 | Marshall | 324/529 |
| 5,189,375 | 2/1993 | Tuttle . | |
| 5,391,991 | 2/1995 | Tuttle . | |

FOREIGN PATENT DOCUMENTS

| | | | |
|---|---|---|---|
| 1791027 | * 4/1979 | (DE) | 324/529 |
| 5750664 | * 3/1982 | (JP) | 324/529 |

* cited by examiner

*Primary Examiner*—Safet Metjahic
*Assistant Examiner*—Anjan K. Deb
(74) *Attorney, Agent, or Firm*—Paul S. Clohan, Jr.; William Randolph

(57) ABSTRACT

A system and method for locating flaws in cable shields and electromagnetic tubing (shield conduit) without disconnection of the cable or conduit under test is described. The fault location method, using a unique sensor array and fault detection circuit, supplements capabilities of earlier inductance/resistance tester. Previous inductance/resistance testers allow the user to measure very small resistances at cable/connector joints, usually without disconnecting the circuit under test.

15 Claims, 6 Drawing Sheets

CABLE SHIELD FAULT LOCATOR

BACKGROUND OF THE INVENTION

Large electronic systems rely on cables to carry electrical power and signals between units and locations housing such electronics units. The single most important element in the maintenance of system protection from electromagnetic pulse effects and various noise sources is the integrity of the shielding of signal and power cables (coaxial and multiconductor) and any metallic tubing that provides such shielding. These system elements are prone to degradation over time from various environmental sources such as, for example, corrosion, oxidation, and mechanical stress. Such degradation effects may lead to loss of protection, compromise of security, or to intermittent equipment malfunction. Previous inspection methods and apparatus required partial disassembly of the cables. Conduits to be inspected had to be disconnected for testing, and the analysis of the test results required trained and highly skilled technical personnel for accurate detection and diagnosis.

Previous inductance/resistance test sets did not allow cables and conduits to be inspected in-situ without disconnection. The present invention can be used by relatively unskilled personnel, and without disconnecting the cables. Environments where the cable shield fault locator would be used include fixed and mobile communications facilities, military and commercial aircraft, naval; ships, and combat vehicles (i.e., tanks).

Flaws in the shields of cables can often be traced to connector connections. U.S. Pat. No. 5,189,375 includes a method and apparatus which can be used to inspect for resistive joints that may occur in ground/grounded connectors on cables, including shielded cables. Resistive joints are not the only flaws in cable shielding integrity, however. These flaws can result from an improper bond between cable shield and connector back shell, mechanical stress, metallic oxides, and the like, which introduce resistances in series with the shield and reduce the effectiveness of the shielding by introducing electromagnetic flux disturbances in the shielding path. When resistive flaws at connectors were found to be present, they could sometimes be detected by direct measurement of the cable shield resistance with, for example, a milliohmmeter.

Such shielding integrity flaws as occur at points along the length of the cables, however, have been more difficult to detect.

U.S. Pat. No. 5,391,991, also shows a resistive shielding flaw detector. The U.S. Pat. No. 5,189,375 also shows a method and apparatus for locating shielding integrity flaws by resistance techniques. The presence of a flaw in the shield will be indicated by an increase in the transfer impedance (ohms per unit length) or shield resistance (ohms) above a precisely established maximum permissible value. Typically acceptable values of cable shield resistance in working systems normally range from about ten milliohms (0.01 ohm) to several tenths of an ohm, depending upon cable parameters as length, diameter, characteristics of the shield material, and allowable junction resistances.

It is not always desirable to attempt detection of cable shield flaws by measurements of transfer impedance or shield resistance by standard techniques. The techniques described in U.S. Pat. No. 5,189,375 require that the equipment terminating the cable under test be disconnected for the resistance test. When measurements are made on a cable disconnected from its terminating equipment, a serious flaw may go undetected. Disconnection may relieve the mechanical stress that caused the defect, or may eliminate a resistive junction between a cable connector and the equipment connector. The movement may also create an additional defect that may easily be traced and corrected, leaving the original problem uncorrected. Additional serious degradation in cable shield protection may or may not be detectable with these techniques. The defects may reside in the cable shielding per se rather than in the connectors. Shield defects may exist between the equipment connector and the equipment itself. Thus, inspection for cable shield flaws should be performed with all the cables installed so that all sources of shield degradation will be present and detectable in the normal operating environment.

Other flaws may result in serious electromagnetic flux disturbances passing through the cable shield. These flaws are often very difficult to detect and locate without disassembly of the cables from the equipment, and may not be easily detected. Additional flaws may be caused by reinstallation of the cables. Therefore, detection of shield flaws caused by shield degradation should be performed with the cables normally connected.

SUMMARY OF THE INVENTION

The present tester fills a technical void in the areas of system life-cycle survivability, electromagnetic interference control, lightning protection, and nuclear electromagnetic pulse (EMP) hardness maintenance surveillance. The technical advance is an improved ability to inspect the shield systems, detect problems, and to enable repair of degraded cable shields as they are used. The test may be performed on a routine and continuous basis.

The cable shield fault locator of the present invention relies on the inductance test apparatus concept applied to electromagnetic measurement of cable shield flaws. Portions of inductance/resistance test set are shown in U.S. Pat. Nos. 5,189,375 and 5,391,991, issued in the name of the present inventor and assigned to the present assignee. The present invention is composed of four functional elements, which can be separate assemblies: an inductive coupler, a coupler driver test signal source, and an inductively coupled current probe portion that includes a movable sensor array, and a fault detector having an amplifier and threshold detector therein. These elements may optionally be used in combination with a conventional high-quality portable oscilloscope for visual displays indicating defects.

Accordingly, it is an object of the present invention to provide an inductively coupled and sensed measurement method and apparatus for testing the cable shielding for electromagnetic integrity, and that can be used without disconnecting the cable under test.

It is another object of the present invention to provide an inexpensive cable shielding integrity test set that works with a conventional high-quality oscilloscope to provide a continuous display of inductively sensed responses to a pulsed current waveform induced on a cable by the test apparatus.

These and other objects and advantages of the present cable shield fault locator for use with a shielded electrical pathway having an axial dimension extending between first and second locations are achieved by a cable shield fault locator having a coupler driver generating an electrical signal current; an inductive coupler, fixed in place circumjacent the shielded electrical pathway near the first location, adapted to couple the electrical signal current to the shields; an inductive sensor array, circumjacent the shielded electrical pathway and axially movable between the inductive coupler and the second location, adapted to sense an electrical signal current passing along the shield; and means for detecting a disturbance in the electrical signal current passing along the shield.

The method of detecting cable shield faults with a cable shield fault locator according to the present invention includes the steps of generating an electrical signal current in a coupler driver; inductively coupling the electrical signal current to flow axially along an elongated cable shield at a first location and generate a magnetic field about the shield; inductively sensing the presence of the magnetic field about the shield at a second location displaced along the axis of the shield and separated from the first location; detecting a disturbance in the magnetic field at the second location by comparison with the source electrical signal current; and then perceptibly indicating the existence of said magnetic field disturbance. The induced signal current may be pulsed in order to aid detection.

The coupler and coupler driver induce a repetitive (preferably about 25 Hz), long duration (200 microsecond) current pulse signal on the conductor shielding under test; the induced pulse current signal is electromagnetically sampled via an inductively coupled current probe, and a waveform representative of a voltage proportional to the induced current is displayed continuously by an oscilloscope. The desired resistance value is obtained from the peak amplitude of the displayed waveform, the known constant ($E_t$) of the coupler/driver combination, and the known transfer impedance ($Z_t$) of the current probe. Measurement of electromagnetic shielding flaws by this method provides a system whereby the presence of a defective cable shield or electromagnetic conduit can be consistently identified with accuracy.

BRIEF DESCRIPTION OF THE DRAWING FIGURES

Figure 6:
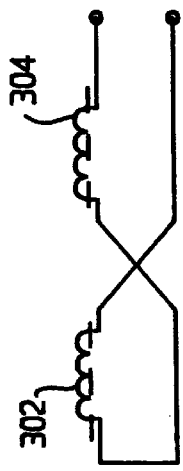
Figure 9:
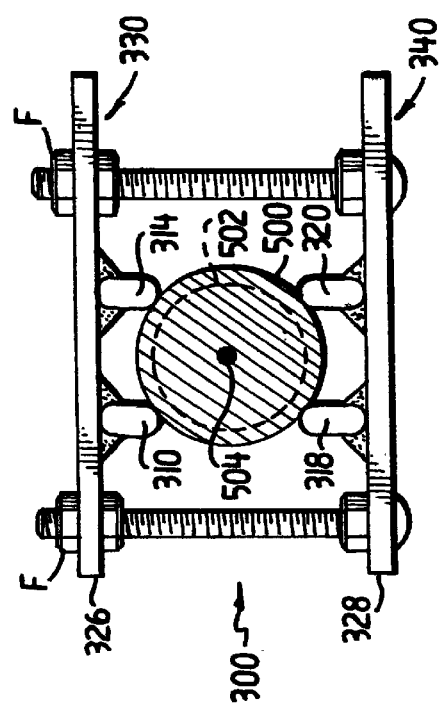
Figure 5A:
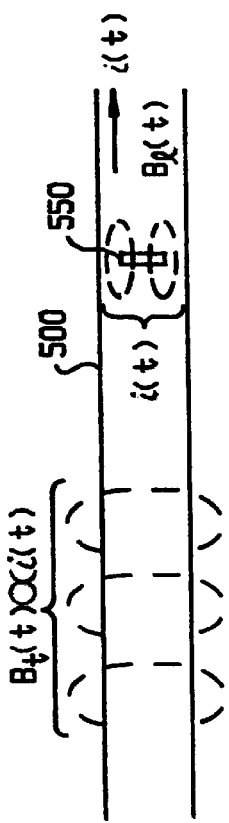
Figure 5B:
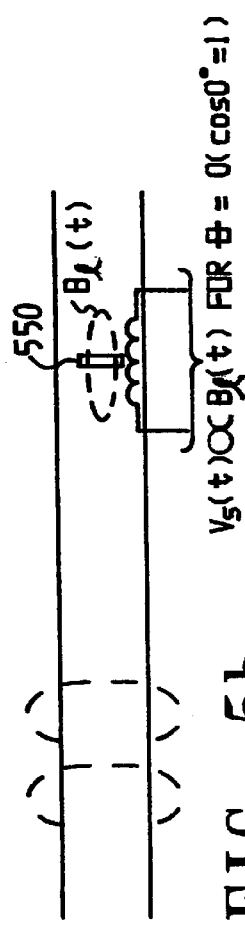
Figure 5C:
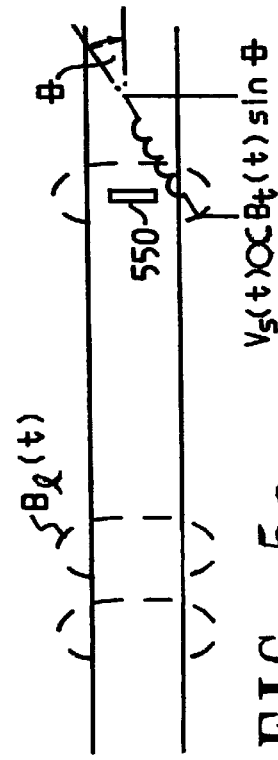
Figure 8:
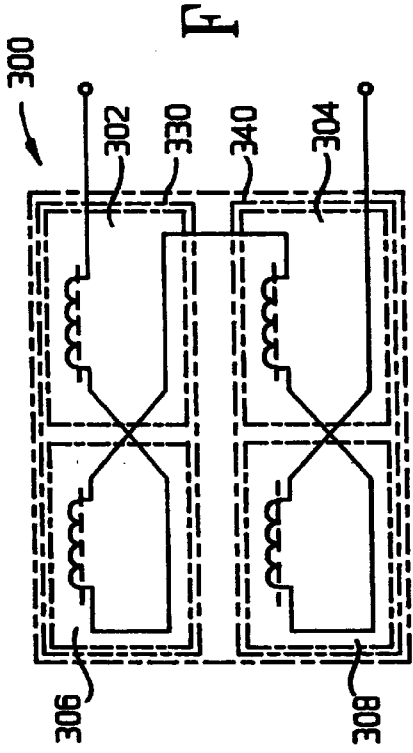
Figure 7A:
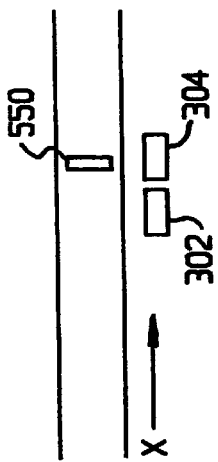
Figure 11:
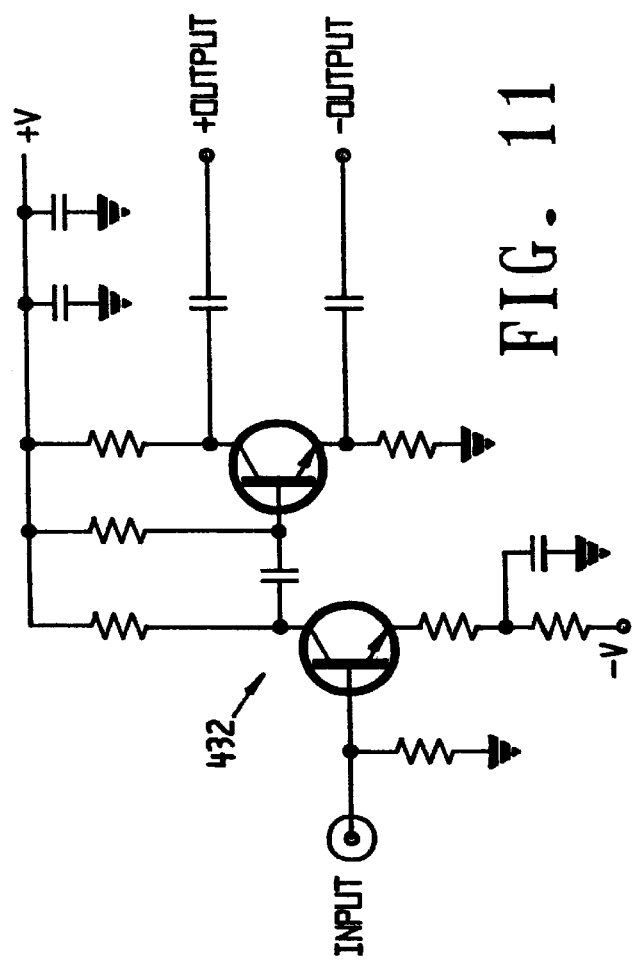
Figure 7B:
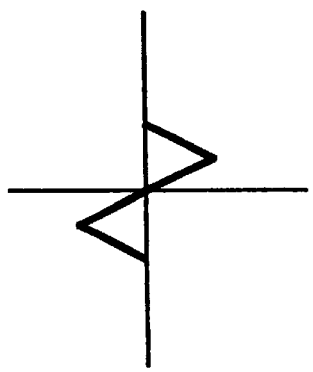
Figure 10A:
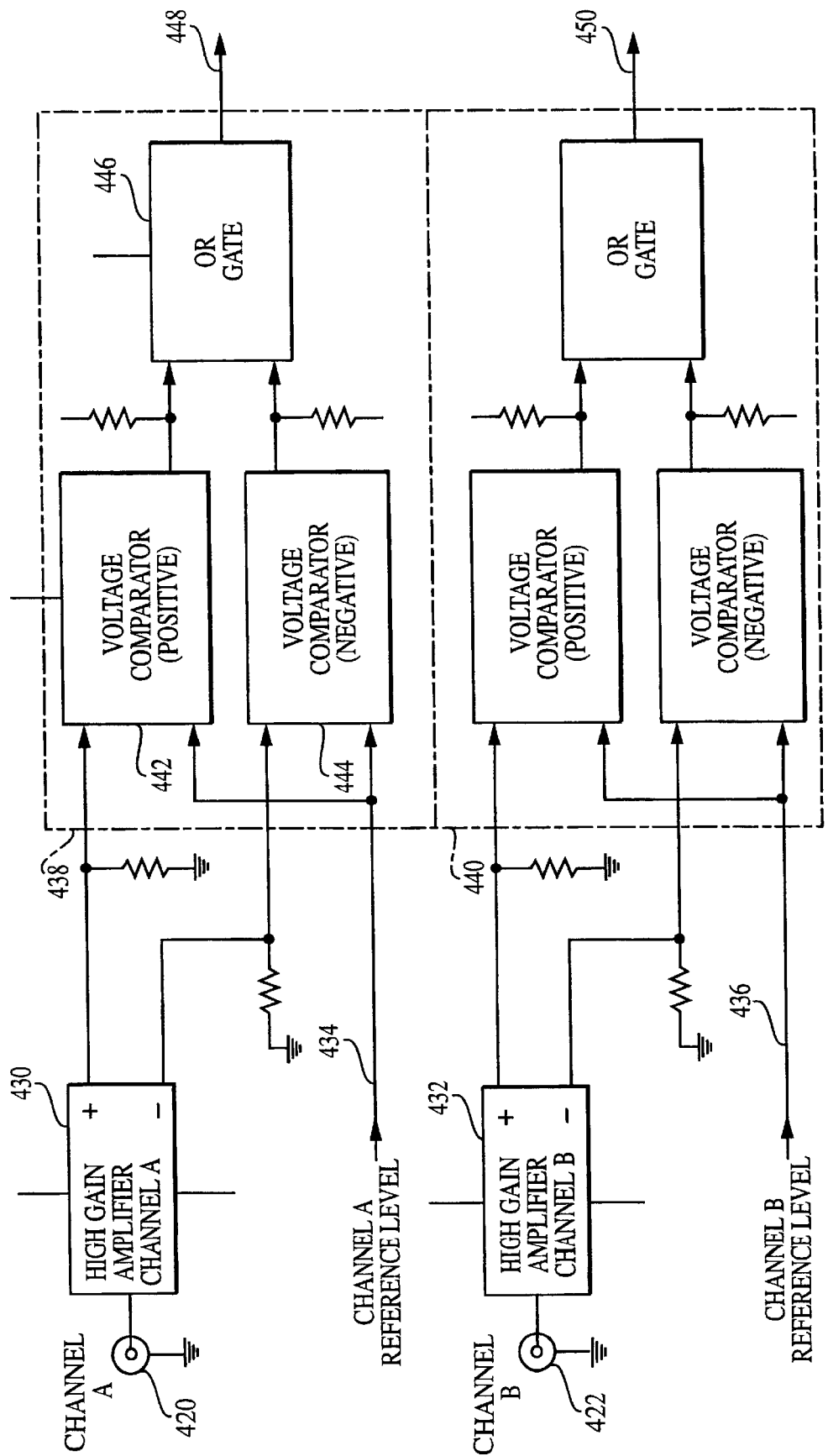
Figure 10B:
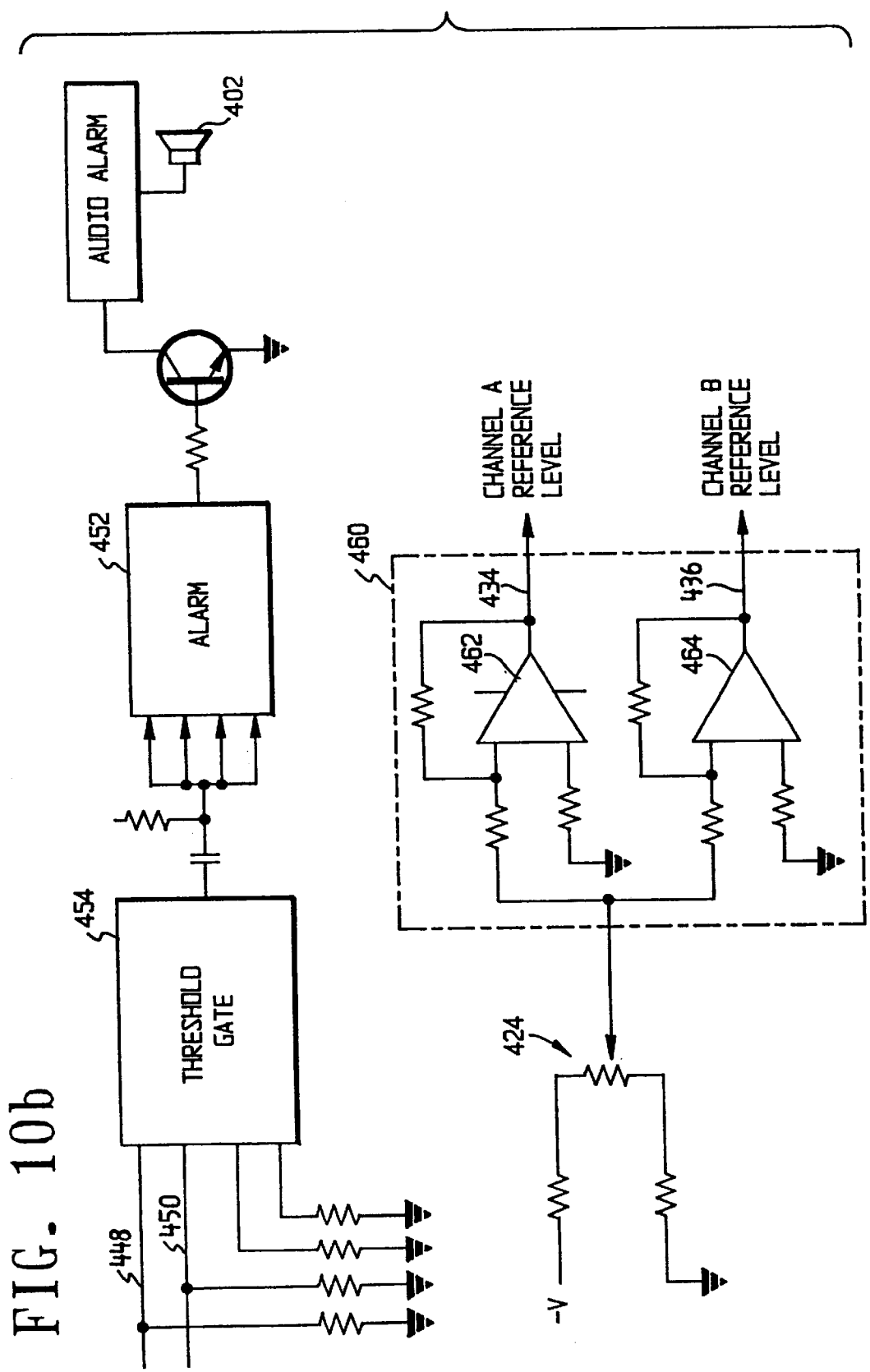

FIGS. 5a, 5b, and 5c are illustrations of the pulsed magnetic fields around a conductor, wherein the magnetic lines of flux are shown in broken line form;

FIG. 6 is a schematic diagram of a two-coil sensor;

FIGS. 7a and 7b are illustrations of the positioning of the two-coil sensor and the resulting signal waveform resulting from passing the sensor past a cable shield fault;

FIG. 8 is a schematic diagram of a four-coil sensor;

FIG. 9 is an illustration of a two-sensor array, each comprising four coils, enclosing a cable;

FIGS. 10a and 10b form a simplified schematic diagram of the fault detector; and FIG. 11 is a simplified schematic diagram of a high-gain amplifier for use with the sensor array and fault detector.

DETAILED DESCRIPTION OF THE PREFERRED EMBODIMENT

The main elements of cable shield fault locator of the present invention are shown in FIGS. 1–11; and include the following:

1. Inductive Coupler 100;
2. Coupler Driver 200;
3. Sensor Array 300;
4. Fault Detector 400; and
5. Associated Interconnect Cable(s) 500.

Figure 1:
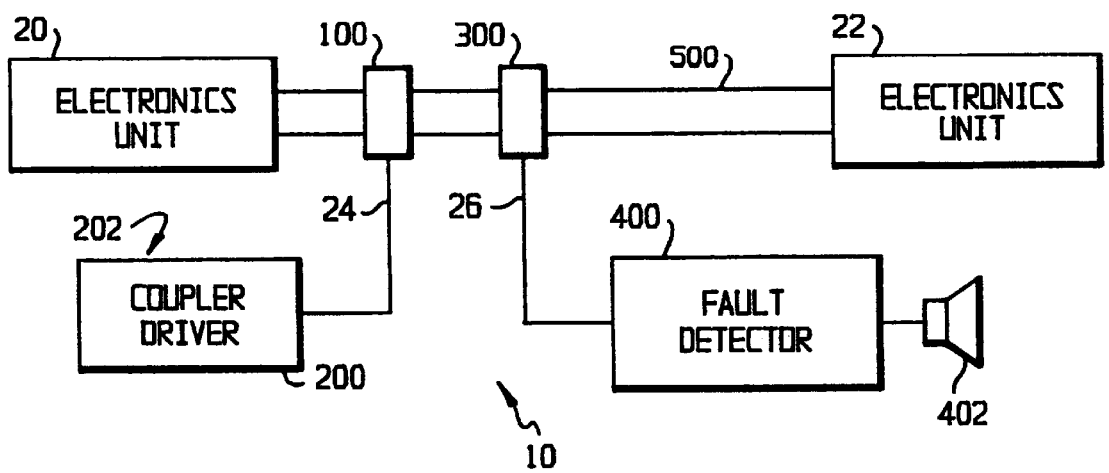
FIG. 1 is a simple block diagram of the cable fault locator test set of the present invention as used to identify faults in a cable under test.
Figure 2:
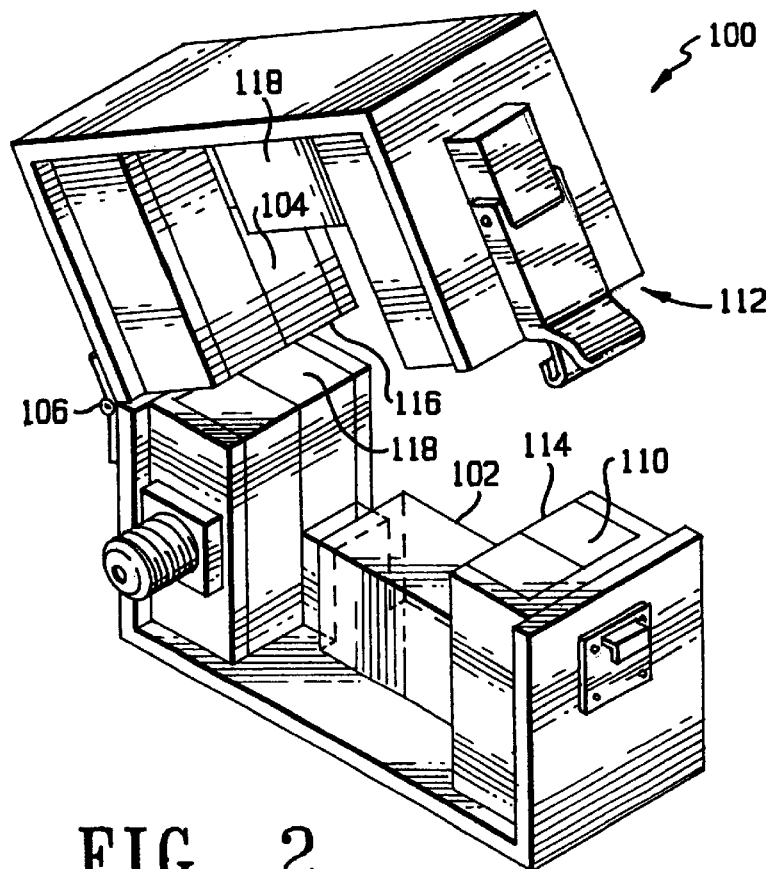
FIG. 2 is a perspective view of an inductive coupler used with the present invention.

Referring to FIG. 1, a test signal is coupled via coax 24 to a cable 500 interconnecting two electronic units 20 and 22. The coupler driver 200 generates the desired signal, a repetitively pulsed current signal. This pulsed current signal is induced on the conductor (shield) under test by an inductive coupler 100 and coupler driver 200 combination. The inductively coupled sensor array 300 connected to fault locator 400 via another coax cable, and to a high-quality, portable oscilloscope if desired.

The teachings of U.S. Pat. Nos. 5,189,375 and 5,391,991 are incorporated herein by reference.

In the detailed description that follows, the functional components of the inductive cable shield fault locator required to induce a repetitively pulsed current on the cable 500 or conduit under test will be primarily discussed. These elements include the inductive coupler 100 and the coupler driver 200.

Referring first to FIG. 1, the cable shield fault locator 10 inductive coupler 100 is attached to a shielded cable 500 connecting two hypothetical shielded electronics unit enclosures 20 and 22. Through the inductive coupler and coupler driver 200 in combination, a repetitive, low-level, and limited-bandwidth, pulsed current test signal is induced on the cable 500. (The nature of the test signal is described hereinafter with reference to FIGS. 5a through 5c.) A current flow along the conductor shielding will result in a predominant component of the magnetic field present about the surface of the cable shield. Inducing this pulsed signal current on cable 500 results in the formation of a series of ring-shaped (transverse) magnetic field pulses moving along the length of the cable 500. The sensor array 300, laying circumjacent the cable, is moved slowly from one end of the cable to the other in order to sense changes in the magnetic field on the surface of the cable 500 and precisely locate any such changes along its length. The sensor array 300 responds to the longitudinal (e.g., axial) component of the magnetic field that will be generated in the vicinity of the flaw by the current flowing through the cable shield. The test signal is not imposed on the cable core wire(s) 504 as these test signals flow primarily through the shield 502 only. (The cable is shown in cross section in FIG. 9.) When the sensor array 300 encounters a shielding flaw, the fault detector 400 signals the presence of the fault, preferably with an audible alarm 402. The precise location of the flaw may then be marked, as with a gummed label or nylon cable tie for identification and correction.

Basic embodiments of the inductive coupler 100 and coupler driver 200 are described in U.S. Pat. No. 5,391,991, assigned to the assignee of the present invention, the teaching of which is hereby incorporated by reference. See FIGS. 7–10 thereof and FIG. 2 hereof.

Figure 3:
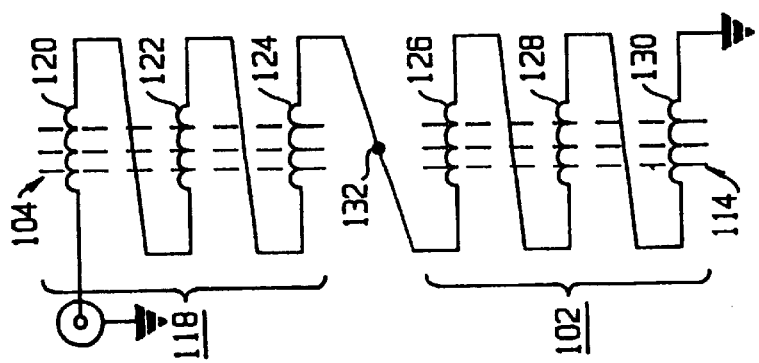
FIG. 3 is a schematic diagram of the inductive coupler of FIG. 2.

The inductive coupler 100 includes a pair of multiturn coils 102, 118 wound on two C- or U-shaped ferrite cores 104, 114 housed within a hinged (106), non-magnetic casing 108, which may preferably be of aluminum or the equivalent. The hinged casing allows opening and closing of the coil assembly about a conductor such as cable 500. Here, FIG. 3 illustrates two coils 102, 118 and two ferrite core halves in which each ferrite core half 104, 114 uses a core having three layers of windings 120, 122, 124 to form a coil 118. Each of the two sets of three windings 120, 122, 124 and 126, 128, 130 are attached at the middle 132. When the coupler 100 is attached to a cable 500, the two U-cores are joined at their respective open ends 110, 112 and 116, 118 to form a complete loop magnetic paths, in the form of a circle or rectangle, which radially encircles the cable 500 cross section. Mechanical details of the inductive coupler 100 are illustrated in greater detail in FIG. 2. FIG. 3 shows an electrical schematic of the device.

Figure 4:
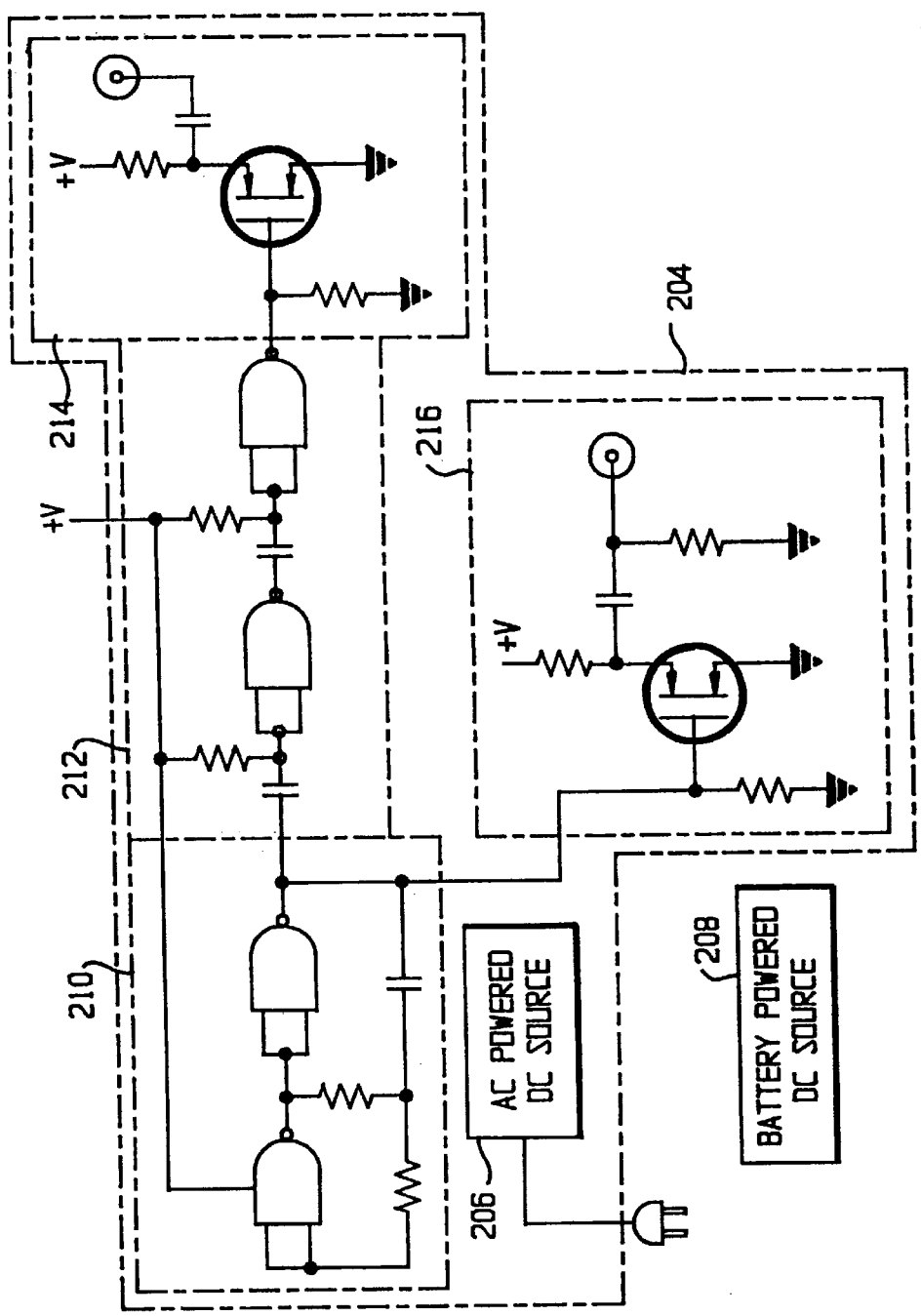
FIG. 4 is a simplified schematic diagram of a coupler driver used with the inductive coupler of FIG. 2.

The coupler driver 200 of the preferred embodiment preferably comprises a solid state circuit for convenience. It can be mounted on a P.C. board and housed within a shielded protective box 202 of metal or the like. Two embodiments of the coupler driver are contemplated: a battery powered model 202 and an AC powered model 204. Further details showing operation of the coupler driver 200 are illustrated in FIG. 4. Both embodiments use the same circuit, having four operating portions: as a frequency generator, an astable multivibrator 210; a monostable or one-shot delay 212; an output driver, which may, for example, use a power MOSFET as an amplifier; and an optional oscilloscope trigger driver 216. These are all conventional circuits known to the person having ordinary skill in the electronics arts.

An important element of the cable shield fault locator test set of the present invention is the sensor array 300, shown and described in FIGS. 5–9. The sensor array 300 can be formed of at least one inductive sensor 302, 304 oriented to sense the longitudinal (e.g., axial) components of the magnetic field generated near a flaw in the shield 502 of a cable 500 where the shield carries an electrical current generated by the coupler driver 200. An array of two (FIG. 6), and preferably four inductive sensor coils (FIG. 8) is contemplated, arranged such that each respective inductive sensor 302, 304, 306, 308 is oriented to sense the magnetic field. The configuration of these sensors is such as to be less sensitive to the much stronger, normal transverse magnetic field component present over the entire cable 500 length due to the induced test signal. The sensor array 300 in use is coupled to a conductor (shield) under test in the manner illustrated in cross section view in FIG. 9. The sensor array 300 is advanced over the length of the conductor 500 in increments of one to two inches (for example, depending upon sensitivity and operator skill), as shown in FIG. 9. At each incremental position along the conductor length, the sensor array 300 is rotated one-half turn to scan another 180-degree arc on the surface of the conductor 500 shield 502. If a flaw is encountered, such as signaled by an audible alarm 402, the point along the cable length over which the sensor array 300 passed when the alarm became triggered is marked for identification.

Each of the four inductance coils 302, 304, 306, and 308, such as are normally used as components in a filter or network, is used as a current sensor; its axis is aligned perpendicular to the longitudinal direction of pulsed test current flow. Its windings are excited by lines of magnetic flux emanating from the conductor carrying the current. In response to this excitation, each inductor generates an output voltage proportional to the test current sensed. The fault locating sensor array can be built in one-, two- or four-inductor embodiments, as shown in FIGS. 5 through 8.

In FIGS. 5a through 5c, a section of a tubular conductor element 500 is shown with a transverse flaw 550 (semicircular slot) near the right end in this view. Time-varying current i(t) flaws exist along the surface 500 as indicated and a corresponding transverse magnetic field $B_t(t)$ exists over the conductor length. As the current encounters the slot flaw 550, it divides into two paths parallel to the slot and a corresponding longitudinal magnetic field B(t) is established as shown. To detect the transverse slot, an inductive sensor is placed near the slot and aligned to intercept the longitudinal magnetic field B(t). For optimum sensitivity, the coil axis must be in perfect alignment with the conductor axis. The voltage output from the sensor in the vicinity of the slot can be stated as:

$$V_s(t) = k_1 \, B_t(t) \sin \Theta \, k_2 \, B_1(t) \cos \Theta$$

(a) where $k_1$ and $k_2$ are geometry and coil-determined coupling coefficients;

(b) $\Theta$ is the angle between the coil axis and the conductor axis; and (c) $B_t$ (peak) $\gg b_1$ (peak).

For ideal alignment, $\Theta = 0$ and $V_s(t) = k_2 \, b_1(t)$.

For a slight misalignment, ($\Theta = 0$) sensor output will be:

$$V_s(t) = k_1 \, B_t(t) \sin \Theta > k_2 \, B_1(t) \cos \Theta.$$

Thus, a slight angular misalignment will yield sensor outputs dominated by the transverse magnetic field and the flaw may go undetected.

To desensitize output to angular misalignment and yet retain sensitivity to the weaker longitudinal magnetic field, a two-inductor cancellation scheme can be used (FIG. 7a). In this embodiment, most sensed contributions to the sensor output arising from transverse excitation are canceled. This embodiment uses two identical, axially aligned, and series-connected inductors (FIG. 6). The optional oscilloscope output of the two-inductor coil sensor array (as a function of distance from a transverse slot 550) is represented in FIG. 7b. It should be noted that sensor output will be maximum at the edges of the slot and minimum near the center.

Although the two-inductor sensor array readily detects most transverse slot flaws in the shield, it is relatively less sensitive to the presence of round holes. Thus, the four-coil sensor array of FIG. 8 embodiment is more sensitive for detecting round and nearly round holes.

A circular hole on the surface of a tubular conductor (e.g., a cable shield) forms a localized obstacle to axial test current flow such that the test current must flow around the hole. Upon encountering the hole, the current flows around it to form a localized two-lobed magnetic field at the front surface. The two-lobed magnetic field will be generally symmetric about an axis that bisects the circular hole and will have both transverse and longitudinal magnetic field components. To detect the hole, the sensor array must be aligned to detect the longitudinal component of the localized magnetic field. If the two-inductor sensor FIG. 8 described in the above embodiment were placed with its center near the front surface of the hole and offset above or below the axis, a small but discernible output voltage will be sensed. To increase sensitivity and make sensor array placement less critical, a second two-inductor sensor array is placed parallel to the first one and then series-connected to it as is illustrated in FIG. 8. In the position of maximum sensitivity, the two rows of series-connected inductor coils in this embodiment straddle the hole so that their respective outputs are cumulated. Thus, both the sensitivity and the area coverage performance characteristics are increased. Applicant prefers the four-inductor sensor array of FIG. 8 in most applications.

FIG. 9 illustrates a two-sensor (330, 340) array 300 found useful in this application. A pair of spaced apart, planar, insulating, and non-magnetic supports 326, 328 are joined mechanically, as by threaded or other fasteners F. Spaced slightly apart on each inward-facing surface of the planar support 326 are mounted two or four coils, such as toroids 310, 312, 314, and 316 312 and 316, are located behind 310 and 314, respectively, in this view). Toroids 318, 320, 322, and 324 are similarly mounted on support 328. These toroid coils are well-known conventional devices. They are known and used for audio-frequency range filters and the like, and are sometimes referred to as "88 millihenry" toroids, though the actual values may vary considerably. Each planar support 326, 328 and its associated coils 310, 312, 314, 316 (or 318, 320, 322, 324, respectively) forms a separate sensor. The coils 310, 314 are spaced apart to accommodate the cable 500 and each coil pair 310, 312 and 314, 316 are aligned in respective planes normal to the planar support. These planes substantially define the space into which the cable 500 is received for the tests. A suitable epoxy can be used to secure the respective inductor coils 310, 312, 314, and 316 318, 320, 322, 324 to the planar supports 326, 328.

The shield hole flaw size that can be detected depends largely upon spacing between the two rows of inductor coils. These sensor arrays, whether one-, two-, or four-inductor, are most effective near the surface of the metal conduit or cable shielding under inspection. Low-noise, high-gain preamplification of the output may be required to render the sensed signals usable. Amplifier gain should typically range from a factor of about 50 to about 100.

The preferred flaw detector embodiment is a battery-powered circuit housed within a metal box that accompanies the sensor array 300 as it is traversed over a section of cable or conduit.

The fault detector 400 (FIGS. 10a and 10b) accepts inputs from the sensor array 300 via the cable 500 shielding 550 and activates an alarm 402 when the sensed signal amplitude, from one or both channels, exceeds an adjustable detection threshold 424 as adjusted by the operator. The detection threshold determines the minimum amplitude to which the fault detector 402 can effectively respond. This adjustment enables the operator to compensate for lower amplitude surface currents (e.g., weaker magnetic field) associated with larger diameter conduit (especially where diameter d is equal to or greater than 2 inches) or to compensate for degraded (resistive) cable shield conditions.

High gain amplifiers 430, 432, shown in detail in FIG. 11, raises the detected sensor output signal levels to useful operating values at inputs 420, 430 to the fault detector.

Generally, one amplifier per sensor will be sufficient. Reference levels from the fault locator 400 threshold adjustment 424 (FIG. 10b) are provided separately via lines 434, 436 to Channel A and Channel B (respectively) threshold detectors 438, 440. Each threshold detector 438, 440 includes a pair of voltage comparators 442, 444 and an OR gate 446, wherein the comparator outputs 448, 450 can trigger an alarm at alarm amplifier 452 via threshold gate 454. The alarm signal is amplified and output at alarm output 402, which may be a piezoelectric buzzer, for example.

The Channel A and Channel B threshold levels are set in common by a potentiometric voltage divider 424, the output of which is amplified by threshold amplifier 460 having separate amplifiers 462, 464. As discussed above, these threshold outputs are provided to the threshold detectors 438, 440 via lines 434, 436.

With the foregoing and other objects, advantages and features of the invention that will become hereinafter apparent, the nature of the invention may be more clearly understood by reference to the following detailed description of the invention, the appended claims and to the several views illustrated in the attached drawings.

Although certain presently preferred embodiments of the invention have been described herein, it will be apparent to those skilled in the art to which the invention pertains that variations and modifications of the described embodiment may be made without departing from the spirit and scope of the invention. Accordingly, it is intended that the invention be limited only to the extent required by the appended claims and the applicable rules of law.

What is claimed is:

1. A cable shield fault locator for use with a shielded electrical pathway having an axial dimension extending between first and second locations, comprising:
   a coupler driver generating an electrical signal current;
   an inductive coupler, fixed in place circumjacent the shielded electrical pathway near the first location, adapted to couple the electrical signal current to the shields;
   an inductive sensor array, circumjacent the shielded electrical pathway and axially movable between the inductive coupler and the second location, adapted to sense an electrical signal current passing along the shield; and
   means for detecting a disturbance in the electrical signal current passing along the shield.

2. The cable shield fault locator of claim 1, wherein the coupler driver comprises a rectangular wave source and a predetermined delay circuit coupled to the rectangular wave source and adapted to delay passage of the rectangular wave therethrough.

3. The cable shield fault locator of claim 2, further including an amplifier coupled to the rectangular wave source to provide an oscilloscope trigger output.

4. The cable shield fault locator of claim 1, wherein the inductive coupler further comprises a housing, a first split ferrite core half, a second split ferrite core half, said housing includes first and second half portions each containing a ferrite core half joinable to form a closely coupled ferrite inductor having an axis therethrough, and first and second apertures in the housing aligned with the axis and adapted to permit the coupler to circumscribe the shielded electrical pathway.

5. The cable shield fault locator of claim 4, wherein each split ferrite core half includes a trifilar winding connected for flux addition of a current passing therethrough.

6. The cable shield fault locator of claim 1, wherein said sensor array includes first and second inductive sensor elements oriented to sense a longitudinal component of magnetic field disturbance arising from a flaw in the shielding.

7. The cable shield fault locator of claim 6, wherein each of the first and second inductive sensor elements includes an even number of inductance coils.

8. The cable shield fault locator of claim 6, wherein the first and second inductive sensor elements are disposed opposite one another on opposing sides of the shielded electrical pathway.

9. The cable shield fault locator of claim 7, wherein each of the inductance coils are wound on an elongated core.

10. The cable shield fault locator of claim 7, wherein each of the inductance coils is wound on a straight elongated core, having an axis, and wherein the axis is aligned perpendicular to the direction of current flowing in the shielded electrical pathway such that its windings are excited by lines of magnetic flux emanating from the shielded electrical pathway resulting from a current passing therethrough.

11. The method of detecting cable shield faults with a cable shield fault locator, comprising:
   generating an electrical signal current in a coupler driver;
   inductively coupling the electrical signal current to flow axially along an elongated cable shield at a first location and generate a magnetic field about the shield;

inductively sensing the presence of the magnetic field about the shield at a second location displaced along the axis of the shield and separated from the first location;

detecting a disturbance in the magnetic field at the second location by comparison with the source electrical signal current; and indicating the existence of said magnetic field disturbance.

12. The method of claim 11, wherein said electrical signal current is created by generating a rectangular waveform and delay form with a delay circuit of predetermined interval.

13. The method of claim 12, further including the step of amplifying said rectangular waveform to provide an oscilloscope trigger output.

14. The method of claim 11, wherein the magnetic field is sensed with a sensor array including first and second inductive sensor coils disposed opposite one another on opposite sides of the shielded electrical pathway, comprising the further step of passing the sensor array axially along the cable shield.

15. The method of claim 14, wherein the magnetic field parallel to the conductor is sensed with a sensor array including first and second inductive sensor coil pairs disposed one another on opposite sides of the shielded electrical pathway, comprising the further step of passing the sensor array radially around the periphery of the cable shield wherein said longitudinal component of magnetic field disturbance is further more precisely located.

* * * * *